US010175892B1

(12) United States Patent
Kim et al.

(10) Patent No.: US 10,175,892 B1
(45) Date of Patent: Jan. 8, 2019

(54) ADAPTIVE READ ALGORITHM FOR A NONVOLATILE MEDIUM

(71) Applicant: Amazon Technologies, Inc., Seattle, WA (US)

(72) Inventors: Kevin Kim, Dublin, CA (US); Jingyu Kang, San Jose, CA (US); Wenzhou Chen, Cupertino, CA (US); Sujan Biswas, Bellevue, WA (US); Truong Nguyen, Los Altos, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/632,073

(22) Filed: Jun. 23, 2017

(51) Int. Cl.
| | | |
|---|---|---|
| *G11C 8/00* | (2006.01) | |
| *G06F 3/06* | (2006.01) | |
| *G06F 12/02* | (2006.01) | |
| *H03M 13/11* | (2006.01) | |
| *G06F 11/10* | (2006.01) | |
| *G11C 29/52* | (2006.01) | |

(52) U.S. Cl.
CPC .......... *G06F 3/0611* (2013.01); *G06F 3/0634* (2013.01); *G06F 3/0647* (2013.01); *G06F 3/0652* (2013.01); *G06F 3/0653* (2013.01); *G06F 3/0679* (2013.01); *G06F 11/1072* (2013.01); *G06F 12/0246* (2013.01); *G06F 12/0261* (2013.01); *G11C 29/52* (2013.01); *H03M 13/1111* (2013.01); *H03M 13/1148* (2013.01); *G06F 2212/1024* (2013.01); *G06F 2212/7205* (2013.01)

(58) Field of Classification Search
CPC ...... G06F 3/061; G06F 3/0634; G06F 3/0647; G06F 3/0652; G06F 3/0679
See application file for complete search history.

(56) References Cited

U.S. PATENT DOCUMENTS

| | | | | |
|---|---|---|---|---|
| 8,621,266 | B2* | 12/2013 | Kang .................. | G06F 11/1068 714/6.1 |
| 8,850,292 | B2* | 9/2014 | Lee ..................... | G06F 11/1072 365/185.09 |
| 9,256,371 | B2* | 2/2016 | Franceschini ......... | G06F 3/0613 |
| 9,613,708 | B1* | 4/2017 | Hsieh ..................... | G11C 16/26 |

* cited by examiner

*Primary Examiner* — Pho M Luu
(74) *Attorney, Agent, or Firm* — Klarquist Sparkman, LLP

(57) ABSTRACT

An adaptive read algorithm for accessing information stored on a nonvolatile medium. The nonvolatile medium can be organized as a plurality of storage units. A method of servicing a read request to the nonvolatile medium can include recording a history of read-retries for read requests to individual storage units of the nonvolatile medium. The method can include adapting a read algorithm for a read request to a particular storage unit based on the history of the read-retries for the read requests to the individual storage units of the nonvolatile medium.

18 Claims, 9 Drawing Sheets

ADAPTIVE READ ALGORITHM FOR A NONVOLATILE MEDIUM

BACKGROUND

Computer systems generally use a memory hierarchy to meet the memory size and memory speed requirements for a given system. A memory hierarchy can include multiple levels of memory having different speeds and sizes. Levels within or closer to a processor core are generally faster and smaller than levels farther from the processor core. For example, the fastest level, closest to the processor core, can include a cache memory implemented with static random access memory (SRAM). An intermediate level can include main memory implemented with dynamic random access memory (DRAM). The next level further from the processor core can include block or bulk storage which is often implemented with a hard disk drive. An alternative form of bulk storage can be implemented using a solid-state nonvolatile medium such as flash memory. Flash memory and other solid-state technology can potentially provide an increase in speed, a decrease in power consumption, and an increase in shock-resistance compared to hard disk drives. However, solid-state nonvolatile media can have different properties than hard disk drives and methods for accessing the information from the nonvolatile media can differ from methods used for other bulk storage technologies.

DETAILED DESCRIPTION

Overview

Figure 1:
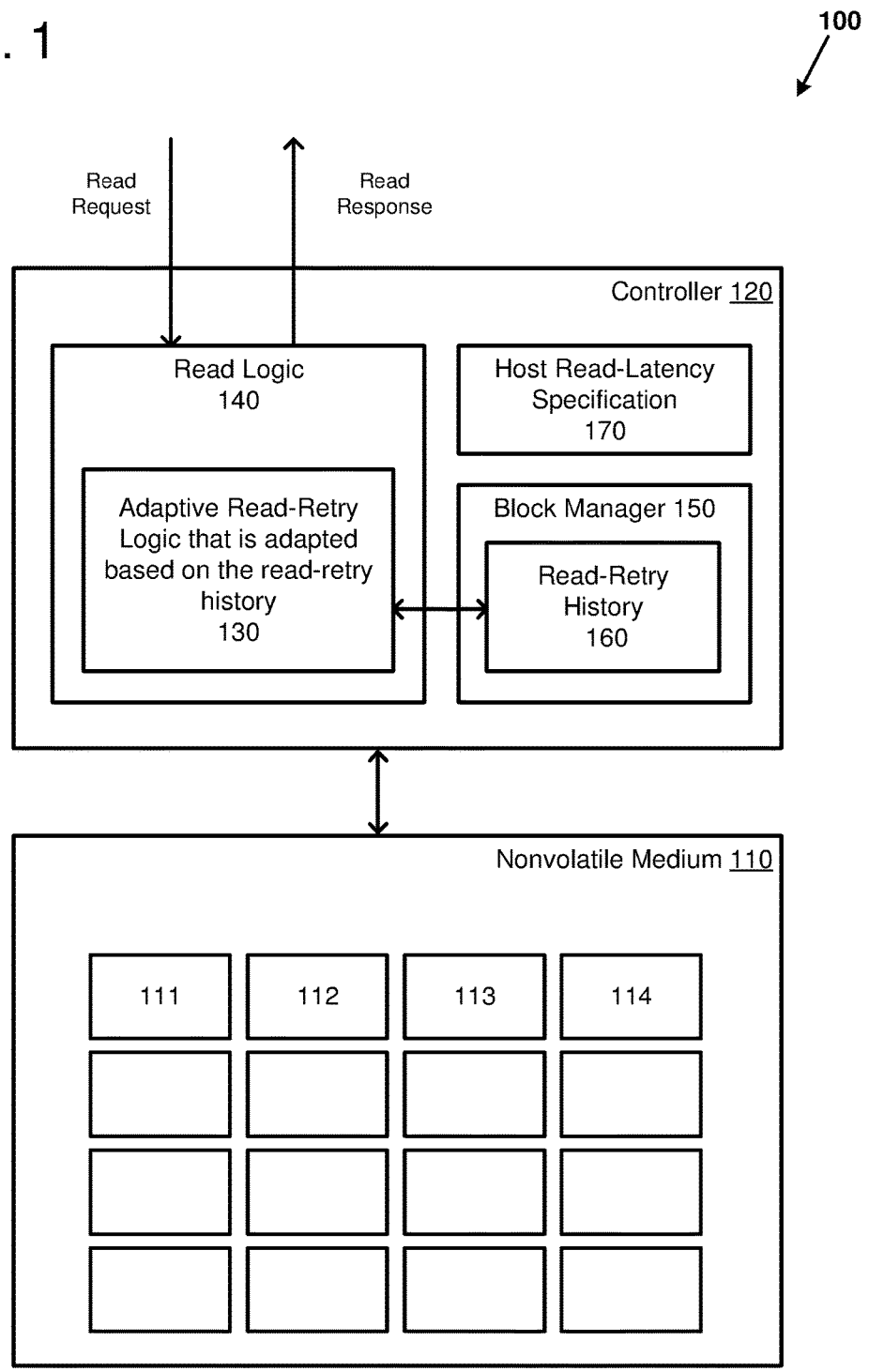
FIG. 1 is a system diagram showing an example of a nonvolatile storage device including a nonvolatile medium and a controller using an adaptive read algorithm for accessing information from the nonvolatile medium.

A nonvolatile medium (also referred to as a nonvolatile memory or NVM) is a computer-readable memory that retains information stored on it after power is removed from the nonvolatile medium. Rewriteable nonvolatile memory can be used as general purpose storage at one or more levels of the memory hierarchy of a computer system. Examples of solid-state rewriteable nonvolatile memory include Flash memory, electrically-erasable programmable read-only memory (EEPROM), ferroelectric random-access memory (FRAM), and magnetoresistive random-access memory (MRAM).

The nonvolatile memory can be organized in various arrangements based on a desired access time and/or access pattern of the memory. For example, a NAND flash memory can be organized into multiple physical blocks, where each physical block contains multiple flash memory cells that are all erased at the same time. A physical block can contain many bytes of information which can be partitioned into smaller groups of information. For example, the information stored on the physical block can be arranged in pages, where a page is typically the smallest amount of information that is written to or read from the flash memory in a given operation. As a specific example, a two gigabyte (GB) NAND flash memory can be arranged into 2,048 blocks, where each block is divided into 64 pages, and each page includes 1,056 16-bit words. The 1,056 16-bit words can be divided into 1,024 data words and 32 error-correcting code (ECC) words. As another example, NAND flash memories can be arranged in 600-700 pages per block, where the page size is eight kilobytes to sixteen kilobytes with 8% to 12% additional space for ECC parity words. The information read from a page of the flash memory can be transferred from the flash memory a byte or a word at a time. Similarly, the information written to a page of the flash memory can be transferred to the flash memory a byte or a word at a time.

Unlike some memory technologies that can be reprogrammed by merely overwriting a new value over an old value, a flash memory cell can be programmed (e.g., written) only after it is erased. In order to reprogram the flash memory cell, the entire physical block containing the cell is erased before the cell can be written with a new value. As described above, the physical block can contain many pages of information. In order to retain all of the information stored on the block, the information stored on any valid pages within the block must be stored outside of the block before the block is erased. For example, any valid pages within the block can be copied to a new location before erasing the block.

The information stored on the flash memory can be moved for various reasons such as increasing an effective capacity of the flash memory and maintaining the integrity of the information stored on the flash memory. Each flash memory device has a finite amount of storage capacity (e.g., 2 GB). As a computer system uses the flash memory, the storage locations of the flash memory can be filled with both valid information and invalid information. The status of the information can be tracked at a granularity of a page, so that each page can be classified as valid or invalid. Valid pages include information that can be used by an application to perform a function of the application. For example, the valid information can include instructions of an application or data used by an application. Thus, the information of a valid page should be available at a different location before erasing a block containing the information of the valid page to potentially avoid data loss. For example, the information of a valid page can be programmed at another location before erasing the block containing the valid page. Invalid pages can include information that cannot be used by an application to perform a function of the application. For example, invalid information can be an unused area of the flash memory or data that was discarded because the data was deleted or replaced with newer data. The information stored on an invalid page can merely be discarded when a block containing the invalid page is erased. Because the physical blocks can contain multiple pages, each of the blocks can include both valid and invalid pages. Moving the valid pages onto a common set of blocks with other valid pages (generally referred to as "garbage collection") can potentially increase a number of free blocks for storing information and/or increase a proportion of valid blocks on the flash memory. The blocks containing invalid pages and information that has been moved can be erased and reprogrammed with new valid data. In this manner, the capacity of the flash memory can be more efficiently utilized because the amount of valid information stored on the flash memory can be increased.

The storage cell of a flash memory includes a transistor with a control gate and a floating gate. To store or write information in the storage cell, the floating gate can be charged by applying a programming voltage to the control gate. The storage cell can be read by applying a variable read-reference voltage to the control gate and measuring a current of the storage cell using one or more sense-amplifiers (sense-amps). When one sense-amp is used, the storage cell is referred to as a single-level cell (SLC) and it can be used to store one non-zero value. When more than one sense-amp is used, the storage cell is referred to as a multiple-level cell (MLC) and it can be used to store more than one non-zero value.

The integrity of the data stored in the storage cells of the flash memory can be affected by environmental conditions, manufacturing variances, and operational conditions of the flash memory. For example, the information stored or programmed in the flash storage cell can potentially be corrupted when neighboring cells are read and/or when the device is subjected to high temperatures or is struck by an alpha particle or neutron. Thus, a charge or signal representing the information stored within a flash memory cell can gradually degrade until the information may no longer recoverable. Error correcting codes can be used to recover the information by adding redundancy to the information. As one example, Low-Density Parity Check (LDPC) codes are one form of error correcting code that can be used to recover the information stored in the flash memory cell. A read algorithm using LDPC decoding can employ an iterative algorithm using different types and/or numbers of read-retry steps to recover the information. For example, a first-retry step can attempt to recover the information stored in the cell using a single read of the cell using a single read-reference voltage (e.g., a base voltage). If the first-retry step is unsuccessful, a second-retry step can attempt to recover the information stored in the cell using a two reads of the cell using two different read-reference voltages (e.g., a first voltage with a positive offset to the base voltage, and a second voltage with a negative offset to the base voltage). Using more reads at different voltages can increase the likelihood of recovering the information, but the additional reads can increase an amount of time to recover the information (referred to as the read latency) due to the additional time to perform the reads and the additional time to perform the decoding using the read data. The read algorithm can include multiple steps that follow a fixed (e.g., pre-defined) sequence until the information is recovered. While the iterative multi-step algorithm is useful for recovering the information stored in the flash memory, it can potentially increase the read latency for a host requesting the information. Specifically, the read latency is increased as more retry steps are performed.

As described herein, the information can be read from the nonvolatile memory using an adaptive read algorithm that can potentially decrease the read latency as compared to a fixed read algorithm. In particular, information can be stored at respective pages of the nonvolatile memory. When the information is read, the retry step that was used to recover the information can be identified so that a history of the retries for each page can be recorded. The read-retry algorithm can be adapted based on the recorded history. Specifically, the read algorithm can be adapted, at a page granularity, to skip earlier steps of the read algorithm when the history of the retries indicates that the earlier steps are likely to fail. Thus, the read latencies for the nonvolatile memory can be reduced by skipping read steps that are not likely to recover the information.

Example Architectures for an Adaptive Read Algorithm for a Nonvolatile Medium

Figure 2:
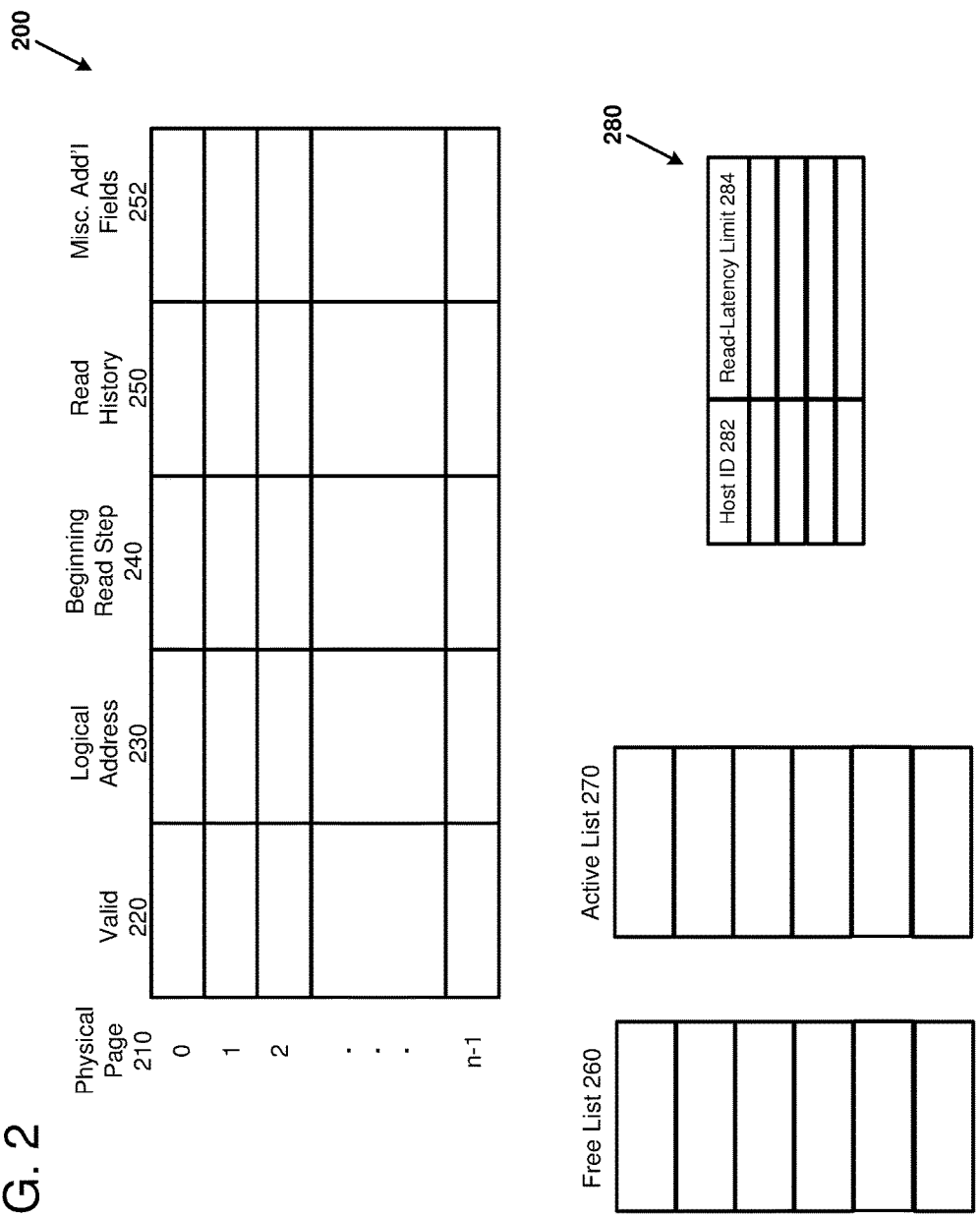
FIG. 2 illustrates an example of various data structures for recording a read-retry history and managing the storage locations of and the information stored on a nonvolatile medium.
Figure 3:
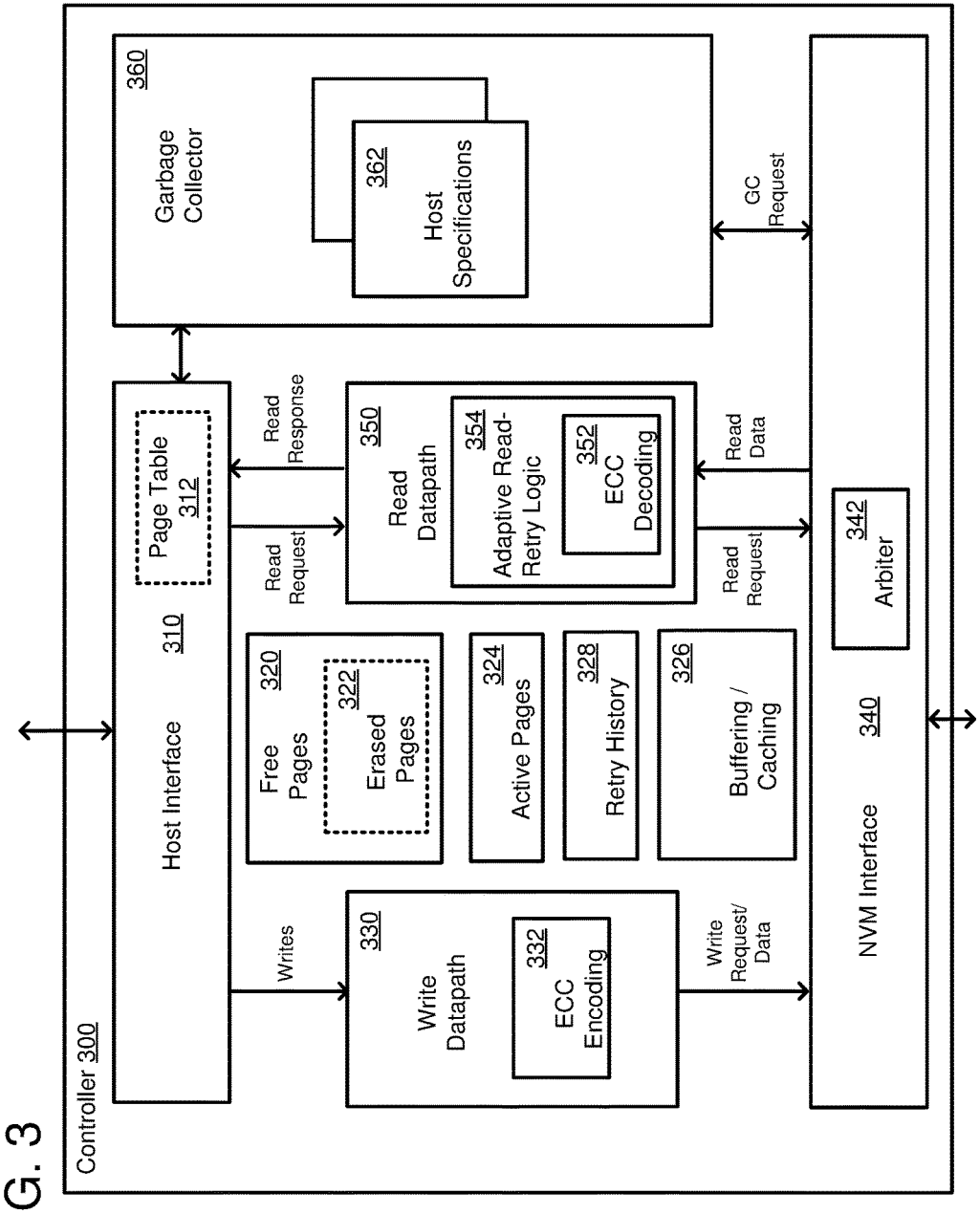
FIG. 3 is a system diagram showing an example of a controller for a nonvolatile storage device using an adaptive read algorithm for accessing information from the nonvolatile medium.
Figure 4:
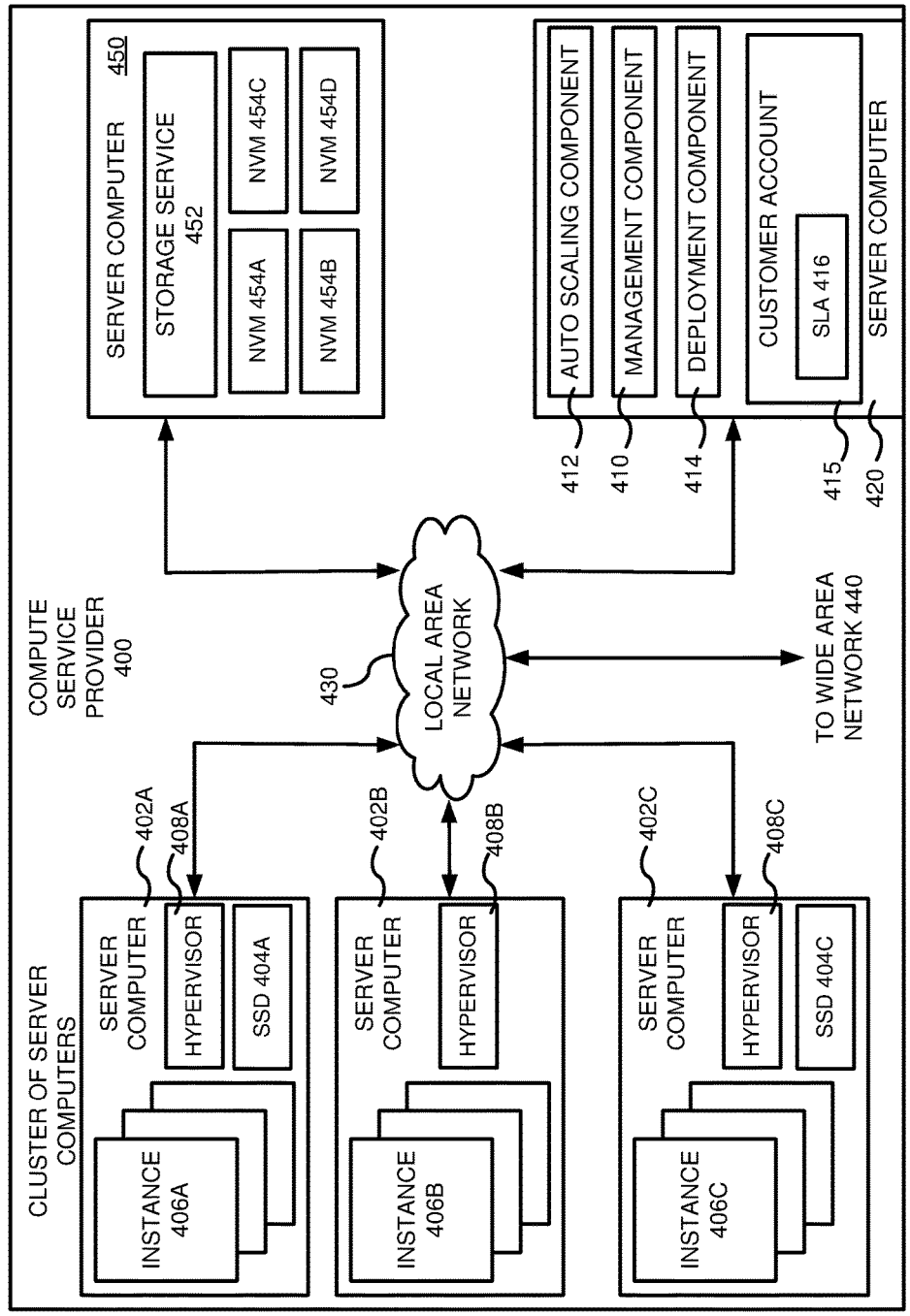
FIG. 4 is an example system diagram showing a plurality of virtual machine instances running in a multi-tenant environment, where the resources of the environment include nonvolatile storage.

FIGS. 1-4 illustrate various aspects of an architecture for managing information stored on a nonvolatile medium. FIG. 1 is a system diagram showing an example of a nonvolatile storage device, such as a solid-state drive (SSD), including a controller and a nonvolatile medium. The controller can use an adaptive read algorithm for accessing information from the nonvolatile medium. FIG. 2 illustrates various example data structures that can be used for recording a read-retry history and managing the storage locations of the nonvolatile medium and the information stored on the nonvolatile medium. FIG. 3 is a system diagram showing an example of a controller for the nonvolatile storage device using an adaptive read algorithm for accessing information from the nonvolatile medium. FIG. 4 is an example system diagram showing an example multi-tenant environment (e.g., a cloud environment). The multi-tenant environment can include server computers that access local nonvolatile storage and/or network-accessible (e.g., remote) nonvolatile storage using a storage service.

FIG. 1 is a system diagram showing an example of a nonvolatile storage device 100 including a nonvolatile medium 110 and a controller 120 using adaptive read logic 130 for accessing information from the nonvolatile medium 110. The nonvolatile medium 110 can be implemented using a variety of technologies, such as NAND flash memory, EEPROM, Ferroelectric RAM, and/or other technologies used for storing information that is retained after power is removed from the device. The nonvolatile medium 110 can include multiple physical blocks, such as blocks 111-114, for storing information. Each of the blocks can be organized as multiple pages and each block can be erased in a single operation. The nonvolatile memory 110 can further include control logic (not shown) for receiving commands from the controller 120. For example, the commands can include commands for reading a page of information, programming or writing a page of information, moving a page of information from one page to another page, and erasing a physical block.

The controller 120 can include hardware and/or software for interfacing with a host device and for managing the nonvolatile medium 110. As one example, the controller 120 can include a processor and memory used for storing data and instructions for managing the nonvolatile memory 110. As another example, the controller 120 can include circuits (e.g., computer hardware, such as an application-specific integrated circuit (ASIC) comprising digital logic and/or analog circuitry) that are programmed or hard-coded to perform functions for managing the nonvolatile memory 110. The controller 120 can act as an interface between a host device (not shown) and the nonvolatile medium 110. For example, the controller 120 can receive information from the host device to be written (e.g., a write request) to the nonvolatile medium 110 and the controller 120 can cause the information to be stored on the nonvolatile medium 110. The controller 120 can receive a request (e.g., a read request) from the host device to retrieve information that was stored on the nonvolatile memory 110 and a controller 120 can cause the information to be read from the nonvolatile memory 110 and delivered to the host device via a read response. Additionally, the controller 120 can perform management functions associated with the nonvolatile memory 110, such as maintaining the integrity of information stored on the nonvolatile memory 110, maintaining a mapping a host addresses to physical addresses of the nonvolatile memory 110, and managing placement of the information within the available storage locations (e.g., the physical blocks) of the nonvolatile memory 110. In particular, the controller 120 can include read logic 140 using adaptive read-retry logic 130, a block manager 150 that can be used to maintain a read-retry history 160, and a host read-latency specification 170.

The block manager 150 can manage how the pages and/or blocks within the nonvolatile memory 110 are used and can maintain operational data (such as the read-retry history 160) about the pages and/or blocks. For example, the block manager 150 can maintain a free-list of blocks that do not contain any stored valid information. The free-list can include blocks that are erased and are ready to receive write data and blocks that contain data that is no longer valid and that will be erased before the block can be reprogrammed. The block manager 150 can erase the blocks with invalid information at predefined intervals or during idle periods when the host device is not requesting information be written to or read from the nonvolatile memory 110. The block manager 150 can select blocks from the free-list in a manner to increase a longevity of the nonvolatile memory 110. For example, the block manager 150 can select less frequently used blocks from the free list before using more frequently used blocks so that the program-erase cycles can be leveled between the different blocks. As another example, the block manager 150 can maintain an active-list of pages that contain valid information. The pages listed in the active-list can be referred to as active pages. The active-list can include references to all or a subset of the valid pages. As one example, the active-list can include references to pages that have recently been written to or read from. The entries of the active-list can include a mapping from a host address to a physical address of the nonvolatile memory 110. The active-list can include additional information about the active pages, such as the read-retry history 160.

The read logic 140 can include logic for receiving and processing a read request, reading information from the non-volatile medium, performing error detection and correction, and responding to the read request. The read request can include a host identifier and a host address. The host address (also referred to as a logical or virtual address) can be mapped to a physical address corresponding to a particular page of a particular block of the nonvolatile medium 110. The adaptive read-retry logic 130 can use a read algorithm having multiple ordered steps. For example, a given step of the read algorithm can perform one or more reads of the physical page, where each read can be performed using a different read-reference voltage. The raw data retrieved from the nonvolatile memory 110 can be transformed using an error decode algorithm (such as LDPC). If it is determined that the read data is decoded without an error, the given step of the read algorithm can end and the decoded data can be returned in a read response. However, if the read data cannot be decoded without an error, the next read-retry step can be performed. Multiple read-retry steps can be performed until the data is recovered or there are no more read-retry steps to perform. Earlier read-retry steps can use fewer reads of the nonvolatile medium 110 to provide decoded read data with less latency than later read-retry steps that can use more reads of the nonvolatile medium 110. Thus, the read latency can be a function of whether a given read-retry step successfully decodes the read data and how many read-retry steps are performed.

The adaptive read-retry logic 130 can be used to potentially reduce the read latency for retrieving decoded read information from the nonvolatile medium 110. Specifically, the read logic 140 can monitor a progress of each read request to determine whether a given read-retry step is successful. The success or failure of each read-retry step can be tracked at the granularity of a page, for example, and stored in the read-retry history 160. As a specific example, the failure or success of each read-retry step can be tracked for the most recent reads (e.g., the last ten reads) to a given page so that a failure rate for the read-retry step can be determined. If the failure rate for the read-retry step is greater than a threshold failure rate, then the read-retry step can be skipped for future reads to the given page. Thus, the beginning read-retry step used for the given page can be based on the read-retry history 160, and read-retry steps having failure rates above the threshold failure rate (e.g., steps that are likely to fail) can be skipped so that the read latency for the given page can be reduced.

As a specific example, the adaptive read-retry logic 130 can include four different read-retry steps that are ordered relative to each other. The steps earlier in the order can have a lower latency and less capability to correct errors. The steps later in the order can have a higher latency and more capability to correct errors. Table 1 shows one example of how the different steps can have different latencies and different capabilities to correct errors.

| Retry Step | Latency (µs) | Error Correction Capability (bits) |
|---|---|---|
| Retry step 1 | 321 | 80 |
| Retry step 2 | 525 | 120 |
| Retry step 3 | 778 | 160 |
| Retry step 4 | 2640 | 200 |

In this example, when only the first retry step is used to successfully decode read data, the latency will be 321 microseconds (µs). However, if the first retry step is attempted but unsuccessful, and the second retry step is used to successfully decode the read data, the latency will be 846 µs (321 µs+525 µs). If all four retry steps are used, the latency will be 4,264 µs. However, by keeping the read-retry history 160, it can be determined when an earlier step is not likely to successfully decode the data, and the earlier step can be skipped. Specifically, if the failure rate for the first retry step is above a threshold (e.g., 80%) for a particular page, the first step can be skipped and the adaptive read-retry logic 130 can begin with the second retry step for the particular page. Thus, rather than taking 846 µs to successfully decode the data using both the first and second retry steps, the latency can be 525 µs using only the second retry step.

The host identifier of a given read request can identify the device and/or user that initiated the read request. Different hosts can have different performance requirements that can be communicated to the nonvolatile storage device 100 using specifications for the respective hosts. As a specific example, the host read-latency specification 170 can indicate a maximum amount of time that a given host will wait for information to be returned from the nonvolatile storage device 100 for a given read request. If the read data for the given read request cannot be recovered within the time specified by the host read-latency specification 170, then the read logic 140 can respond to the request with an error code indicating that the read data was not recoverable. The amount of time to perform each of the read-retry steps can be determined before the read-retry step is performed because it can be a function of the design or architecture of the read-retry step. Thus, in some cases, the read logic 140 can respond with an error code before performing the read-retry step, such as when the architected latency of the read-retry step is greater than the host read-latency specification 170. Additionally, if the read logic 140 cannot recover the read data without error after all of the retry steps of the adaptive read-retry logic have been performed, then the read logic 140 can respond to the request with an error code indicating that the read data was not recoverable.

The block manager 150 can cause information to be moved within the nonvolatile memory 110 in order to maintain the integrity of the information. In other words, the block manager 150 can perform garbage collection. The block manager 150 can use various different criteria to initiate or trigger garbage collection. As one example, garbage collection for a given page can be initiated when the beginning read-retry step for the page is the last read-retry step of the adaptive read-retry logic. As another example, garbage collection for a given page can be initiated when a latency associated with the beginning read-retry step for the page is greater than the host read-latency specification 170. When it is determined that the conditions to initiate garbage collection for a given page are met, the given page can be scheduled for garbage collection. For example, the page can be added to a data structure (such as a list or queue) indicating the page is ready for garbage collection. Garbage collection can include reading the information from the page and moving the information to a different physical page that is selected from the free list. When the information is written to the new physical page, the integrity of the information can increased as compared to the integrity of the information stored at the former physical page. By increasing the integrity of the information, the read latency for the page can potentially be reduced.

FIG. 2 illustrates an example of various data structures for recording a read-retry history and managing the storage locations of and the information stored on a nonvolatile medium, such as the nonvolatile medium 110 of FIG. 1. The data structures can include a page table 200, a free list 260, an active list 270, and a host performance specifications 280.

The page table 200 can include various information about each of the physical pages of the nonvolatile medium. For example, the page table 200 can include an entry for each of the physical pages of the nonvolatile medium. The page table 200 can be organized similarly to the nonvolatile medium. For example, information about physical pages within a physical block can be located in physical proximity to information about other physical pages within the same physical block. In particular, if the block size is 64 pages than the first 64 entries can correspond to the 64 individual pages of physical block zero. Thus, an address of the entry within the page table 200 can correspond directly to a physical page 210.

As one example, an entry of the page table 200 can include a valid field 220, a logical address field 230, a beginning read-step field 240, a read-history field 250, and/or miscellaneous additional fields 252. The valid field 220 can indicate whether the physical page has valid information stored within the physical page. When information is written to the physical page, the valid field 220 can be set to true and when information is deleted from the physical page, the valid field 220 can be set to false. The logical address field 230 can include a value representing a host address corresponding to the physical page. Thus, a host device can use a common address for the information stored at a physical address of the nonvolatile memory regardless of whether the information is moved to a different physical address of the nonvolatile memory. By separating the host or logical address from the physical address of the nonvolatile memory, a controller can manage the physical pages of the nonvolatile memory transparently to the host device.

The beginning read-step field 240 can indicate the read-step of the adaptive read algorithm in which to begin when the physical page is accessed. The beginning read-step field 240 can be initialized when information is written to the physical page. When initialized, the beginning read-step field 240 can indicate the first read-step is to be used when information is read from the physical page. During the operation of the nonvolatile memory, the contents stored in the physical page can degrade and the beginning read-step field 240 can be updated to indicate that a later read-step is to be used when information is read from the physical page. For example, the read history field 250 can be used to track the history of reads to the page, and the history can be used update the beginning read-step field 240. The beginning read-step field 240 can be used to determine a lower-bound on the latency for reading to the page. In particular, the latency to read the page will be greater than or equal to the latency associated with the beginning read-step.

The read history field 250 can be used to track the history of reads to the page. As one example, the read history field 250 can include sub-fields to track the success or failure of the read steps when reading the page. The sub-fields can be arranged in various different ways. For example, the sub-fields can be arranged so that separate sub-fields are used to track the history of different respective read steps. As another example, the sub-fields can be arranged so that the sub-fields only track the history of the read step stored in the beginning read-step field 240. The sub-fields can be used to track a number of reads to the page and success or failure of a given read step. As one example, the read history 250 can be used to track whether the first read step was used to successfully decode read data for the last ten reads. The failure rate for a given read step can be calculated using the success/failure status of the earlier reads, and separate sub-fields can be used to record the failure rates of each read step in the read history 250.

Miscellaneous additional fields 252 can be used to store additional information about the physical page, such as a mapping to a physical block, a program-erase cycle count, whether the physical block is erased, a number of times the page has been read, and so forth. In other embodiments, the entries of the page table 200 can include more or less information about the physical pages. Additionally or alternatively, some or all of the information described above for the physical pages can be kept for a block or a management unit. The management unit can include one or more pages and/or blocks of the nonvolatile medium.

The free list 260 can include a list of pages, blocks, and/or management units that do not currently contain valid information, but are available for storing information. The free list 260 can include references to unused blocks, erased blocks, and blocks containing only invalid information. The free list 260 can include fields describing the various states of the blocks on the list or the various states can be obtained by referencing the page table 200, for example. The active list 270 can include a list of pages, blocks, and/or management units that contain valid information. For example, when the items referenced on the active list 270 are larger than a physical page (e.g., a block or management unit) then at least a portion of the referenced item is valid. In particular, when the active list 270 references blocks, at least one page within the block is valid.

The host performance specifications 280 can include various parameters about hosts that can be used when servicing requests by the hosts. For example, the host performance specifications 280 can include timer values, latency requirements, error tolerance, and so forth. The host performance specifications 280 can include different entries for each respective host that may use the nonvolatile medium. Each entry can include a host identifier (ID) field 282 used to identify a given host. For example, a read request can include the host identifier so that the source of the read request can be determined. An entry can include a read-latency limit field 284 which can be used to indicate an amount of time that a host will wait to receive read data. If the read data takes longer to retrieve and decode than the read-latency limit field 284 then an error code can be generated indicating that the read data cannot be recovered within the read-latency limit.

FIG. 3 is a system diagram showing an example of a controller 300 used to manage a nonvolatile medium and to act as an interface between a host device and the nonvolatile medium. The controller 300 can include hardware and/or software for interfacing with a host device and for managing a nonvolatile medium. As one example, the controller 300 can include a processor and memory used for storing data and instructions for managing the nonvolatile memory and interfacing with the host device. As another example, the controller 300 can include circuits (e.g., computer hardware) that are programmed or hard coded to perform functions for managing the nonvolatile memory and interfacing with the host device. The controller 300 can include a host interface 310 for interfacing with the host device, a nonvolatile memory interface 340 for interfacing with the nonvolatile medium, and a garbage collector 360 for performing various management functions associated with the nonvolatile medium without interaction from the host device.

The controller 300 can include a host interface 310 for interfacing with the host device. For example, the host interface can receive and service commands received from the host device. In particular, the host interface can receive a write command for writing data to the nonvolatile medium, a read command for reading data from the nonvolatile medium, and a delete command for deleting data from the nonvolatile medium. Each command can refer to a particular storage location using an address for the location. The host device can use a set of logical addresses (e.g., virtual addresses) which can be translated to physical addresses corresponding to storage locations of the nonvolatile medium. The host interface 310 can perform a mapping between the logical and physical addresses and the mapping information can be stored in a page table 312. For example, the host interface 310 can select a page from the free pages 320 for storing information when the host interface 310 receives a write command. The free pages 320 can include erased pages 322 that are ready for programming and pages that are free but not yet erased. A reference to the selected page can be added to the active pages 324 when the information is written to the nonvolatile memory. As another example, the host interface 310 can determine the physical address corresponding to a logical address of a read command by searching the page table using the logical address as a key.

The host interface 310 can communicate write requests to a write datapath 330. The write datapath 330 can format the write information for storage onto the nonvolatile memory. For example, the write datapath 330 can include an error correcting code (ECC) encoding engine 332 for adding ECC information to the write data. The ECC information can be used to detect and potentially correct any errors in the write data that are introduced while the data is stored on the nonvolatile medium and/or when the data is a read off of the nonvolatile medium. The write request can be forwarded by the write data path 330 to the nonvolatile memory (NVM) interface 340.

The NVM interface 340 can arbitrate (such as by using an arbiter 342) between different requests of the controller 300. For example, write requests can arrive while read requests are being processed and garbage collection requests can be ongoing with read and write requests. The nonvolatile medium may have a single interface and so different computing requests are sequenced before being sent to the nonvolatile medium. A buffering and caching block 326 can be used to temporarily store data from a request that is waiting to be serviced. Additionally, the buffering and caching block 326 can include storage space for recently and/or commonly requested data. The NVM interface 340 can communicate with the nonvolatile medium using commands to perform functions such as reading a page, programming or writing a page, moving information from one page to another page, and erasing a block. Additionally, the NVM interface 340 can sequence the write data and/or the read data between the controller 300 and the nonvolatile medium. In this manner, the NVM interface 340 can be used to write information to the nonvolatile medium, read information from the nonvolatile memory, and manage the stored information within the nonvolatile memory.

The host interface 310 can receive a read request from the host device and communicate the read request to a read datapath 350. The read datapath 350 can include adaptive read-retry logic 354 that uses an adaptive read algorithm for accessing and recovering information from the nonvolatile medium. The adaptive read-retry logic 354 can track the success and/or failures of the different read-retry steps and can store the tracked information in a retry history data structure 328. As described above with reference to FIG. 2, the retry history data structure 328 can be integrated with the page table 312. Alternatively, the retry history data structure 328 can be stored in a different data structure that is different than the page table 312. The adaptive read-retry logic 354 can use the retry history data structure 328 to determine a beginning read step to use for reading the nonvolatile medium.

Each of the read steps can include multiple sub-steps. For example, a given read step can include reading the nonvolatile medium multiple times, using different reference voltages for each respective read. The adaptive read-retry logic 354 can sequence the sub-steps and can forward a request to perform an action (e.g., to perform a read using a particular reference voltage) to the NVM interface 340 so that the requested data can be read from the nonvolatile medium. The read datapath 350 can buffer the read data returning from the nonvolatile medium, and collect all of the read data (e.g., the read data from all reads of the particular read step) used for decoding the read data. The read datapath 350 can check the collected read data to confirm whether the read data is recoverable without any errors. If errors are detected, the read data path 350 can potentially correct the errors before forwarding the read response data back to the host interface 310 and then on to the host device.

The read datapath 350 can include an ECC decoder 352 for performing error detection and error correction algorithms (such as LDPC decoding algorithms) to detect and/or correct erroneous information that is read from the nonvolatile medium. An LDPC decoding algorithm can use different levels of read retry steps, such as hard decoding and soft decoding. During hard decoding, only hard bit information is used to decode the data. Hard decoding may have weaker error correction capability than soft decoding, but hard decoding has relatively shorter latency (e.g., read time $t_0$) and consequently higher throughput. The ECC decoder 352 can be designed to follow a deterministic flow and so the actual read latency for each read retry step can be a known design parameter. Thus, the read time can be predicted for each page/block by tracking the number of different levels of read retries for each page or block. Additionally, the number of levels of read retries for a given page can trigger data movement from the page when the number of levels of retries exceeds a latency limit for the page and/or a host.

During a first retry step, the ECC decoder 352 can use hard decoding (taking to read time) and transition to soft decoding (e.g., a second or third retry step) only when hard decoding fails to decode the read data. As the data integrity for the information weakens (such as when there have been many reads to the same page), additional or different steps including soft decoding can be performed. For example, hard decoding can be skipped when the failure rate of hard decoding the page exceeds a threshold failure rate. Soft decoding can perform additional soft bit reads and use both hard bit and soft bit information to decode the data. Hence soft decoding can have stronger error correction capability but longer latency and lower throughput than compared with hard decoding alone. As one example, a read retry flow design can have the read retry steps $RR_i$, where i=1, 2, . . . , n having corresponding read time numbers $t_i$, where $t_0 \ll t_1 \ll t_2$, and so forth. By using the adaptive read-retry logic 354, lower read retry steps (where hard decoding is the lowest level) can be skipped if those steps are likely to fail, and the latency can be potentially decreased compared to performing the lower read-retry steps. Because the latency for a given retry step is a design parameter, reads can be avoided altogether when the latency for a read-retry step exceeds the latency specification for a host requesting the read data.

The garbage collector 360 can perform various management tasks associated with the nonvolatile medium. For example, the garbage collector 360 can: schedule free and non-erased pages to be erased so that the pages can be reprogrammed; store host specifications 362 including the read-latency limit for the host; and schedule the movement of information within the nonvolatile medium.

The host interface 310 can receive a host specification from the host device and can forward the host specification to the garbage collector 360 where the host specification can be stored. As one example, the host specification can be configured by the host device during initialization of the controller 300 or the host specification can be adaptively changed based on a particular application running on the host device. There can be multiple host specification corresponding to different users of the nonvolatile medium. For example, a storage service or a storage device used in a cloud computing environment may allocate a given storage resource to multiple customers or users. Additionally, the types of applications using a particular storage system may change over time and so it can be desirable for the controller 300 to adaptively adjust during the operational lifetime of the controller 300.

The garbage collector 360 can determine when and what information to move within the nonvolatile medium based on various criteria such as a number of reads to a management unit of the nonvolatile medium, where a management unit can include one or more blocks, pages, dice, and so forth. When the number of reads of the nonvolatile medium exceeds a trigger value, the garbage collector 360 can schedule information to be moved in order to maintain the integrity of the information. The information to move can be selected from the pages, blocks, or management units contributing to higher read latencies from the nonvolatile medium. As one example, the information selected to be moved can be located in the pages, blocks, or management units having the highest latency. As another example, the information selected to be moved can be located in the pages, blocks, or management units having a read-latency that exceeds the read-latency of any of the hosts accessing the non-volatile medium. The candidate information can be referenced and an active list which lists all of the active pages, blocks, or management units of the nonvolatile medium. When the garbage collector 360 determines that information is to be moved from one page to another page, the garbage collector 360 can issue a request to the NVM interface 340 so that the information can be moved within the nonvolatile medium. Alternatively, the garbage collector 360 can issue a request to the read datapath 350 to read the information to be moved and the read datapath 350 can return the information to move to the garbage collector 360. The garbage collector 360 can then issue a request to the write datapath 330 to write the information to a new physical location selected from the free pages 320. The garbage collector 360 can issue an erase command to the NVM interface 340 to erase the information after the information has been read from the location to be erased.

FIG. 4 is a computing system diagram of a network-based compute service provider 400 (e.g., a cloud provider) that illustrates one environment in which embodiments described herein can be used. Cloud computing is the use of computing resources (hardware and software) which are available in a remote location and accessible over a network, such as the Internet. Users are able to buy these computing resources (including storage and computing power) as a utility on demand. Cloud computing entrusts remote services with a user's data, software and computation. Use of virtual computing resources can provide a number of advantages including cost advantages and/or ability to adapt rapidly to changing computing resource needs. As described below, the users of the computing resources can use nonvolatile storage on a local instance of a computing resource or via a storage service. Performance characteristics (such as a nonvolatile memory read-latency specification) can be specified using a service level agreement.

By way of background, the compute service provider 400 is capable of delivery of computing and storage capacity as a service to a community of end recipients. In an example embodiment, the compute service provider can be established for an organization by or on behalf of the organization. That is, the compute service provider 400 may offer a "private cloud environment." In another embodiment, the compute service provider 400 supports a multi-tenant environment, wherein a plurality of customers operate independently (i.e., a public cloud environment). Generally speaking, the compute service provider 400 can provide the following models: Infrastructure as a Service ("IaaS"), Platform as a Service ("PaaS"), and/or Software as a Service ("SaaS"). Other models can be provided. For the IaaS model, the compute service provider 400 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. The SaaS model allows installation and operation of application software in the compute service provider. In some embodiments, end users access the compute service provider 400 using networked client devices, such as desktop computers, laptops, tablets, smartphones, etc. running web browsers or other lightweight client applications. Those skilled in the art will recognize that the compute service provider 400 can be described as a "cloud" environment.

The particular illustrated compute service provider 400 includes a plurality of server computers 402A-402C. While only three server computers are shown, any number can be used, and large centers can include thousands of server computers. The server computers 402A-402C can be selected from a set of homogeneous or heterogeneous resources. As illustrated, the server computers 402A and 402C include local bulk storage using solid-state drives 404A and 404B, respectively. The server computer 402B may not be configured with a solid-state drive but can access bulk storage using calls to a storage service 452 executing on a server computer 450. The server computers 402A-402C can provide computing resources for executing software instances 406A-406C.

In one embodiment, the instances 406A-406C are virtual machines. As known in the art, a virtual machine is an instance of a software implementation of a machine (i.e. a computer) that executes applications like a physical machine. In the example of virtual machine, each of the servers 402A-402C can be configured to execute a hypervisor 408 or another type of program configured to enable the execution of multiple instances 406 on a single server. Additionally, each of the instances 406 can be configured to execute one or more applications.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

One or more server computers 450 can be configured to execute a storage service 452. The storage service 452 can receive requests from the instances 406A-C to store and retrieve information using bulk storage devices accessible to the storage service 452. For example, the bulk storage devices can include nonvolatile media 454A-D. While only four nonvolatile media 454A-D are shown, any number can be used. The individual bulk storage devices can be reserved for a particular user and/or can be shared by the users of the compute service provider 400. As a specific example, all or a portion of the nonvolatile memory 454A can be reserved for the use or executing instance 406A. As another example, the storage service 452 can allocate storage resources among the different nonvolatile memory 454A-D in a customer independent manner. The storage service 452 can manage the nonvolatile media 454A-D as described above.

One or more server computers 420 can be reserved for executing software components for managing the operation of the server computers 402 and the instances 406. For example, the server computer 420 can execute a management component 410. A customer can access the management component 410 to configure various aspects of the operation of the instances 406 purchased by the customer. For example, the customer can purchase, rent or lease instances and make changes to the configuration of the instances. The customer can also specify settings regarding how the purchased instances are to be scaled in response to demand. The management component can further include a policy document to implement customer policies. An auto scaling component 412 can scale the instances 406 based upon rules defined by the customer. In one embodiment, the auto scaling component 412 allows a customer to specify scale-up rules for use in determining when new instances should be instantiated and scale-down rules for use in determining when existing instances should be terminated. The auto scaling component 412 can consist of a number of subcomponents executing on different server computers 402 or other computing devices. The auto scaling component 412 can monitor available computing resources over an internal management network and modify resources available based on need.

A deployment component 414 can be used to assist customers in the deployment of new instances 406 of computing resources. The deployment component can have access to account information associated with the instances, such as who is the owner of the account, credit card information, country of the owner, etc. The deployment component 414 can receive a configuration from a customer that includes data describing how new instances 406 should be configured. For example, the configuration can specify one or more applications to be installed in new instances 406, provide scripts and/or other types of code to be executed for configuring new instances 406, provide cache logic specifying how an application cache should be prepared, and other types of information. The deployment component 414 can utilize the customer-provided configuration and cache logic to configure, prime, and launch new instances 406. The configuration, cache logic, and other information may be specified by a customer using the management component 410 or by providing this information directly to the deployment component 414. The instance manager can be considered part of the deployment component.

Customer account information 415 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, etc. As a specific example, the customer account information 415 can include a service level agreement (SLA) 416 that specifies operational characteristics of the resources, such as a maximum read latency from block storage. The SLA 416 can be used when initializing an instance for a customer and/or when establishing access credentials to the storage service 452. Specifically, the SLA 416 can include the specified read latency for a particular nonvolatile medium used by the customer. By providing different SLAs for different customers, and using the SLAs to change the behavior of the block storage devices, the block storage devices (e.g., the SSDs 404A and 404C and the NVM 454A-D) can be customized for the individual customers. Thus, the service provider can potentially provide one or a few types of adaptable block storage platforms for all or most of the service provider's users which can potentially improve the maintainability and scalability of the computing resources while providing the users with different performance options.

A network 430 can be utilized to interconnect the server computers 402A-402C and the server computers 420 and 450. The network 430 can be a local area network (LAN) and can be connected to a Wide Area Network (WAN) 440 so that end users can access the compute service provider 400. It should be appreciated that the network topology illustrated in FIG. 4 has been simplified and that many more networks and networking devices can be utilized to interconnect the various computing systems disclosed herein.

Example Methods for an Adaptive Read Algorithm for a Nonvolatile Medium

Figure 5:
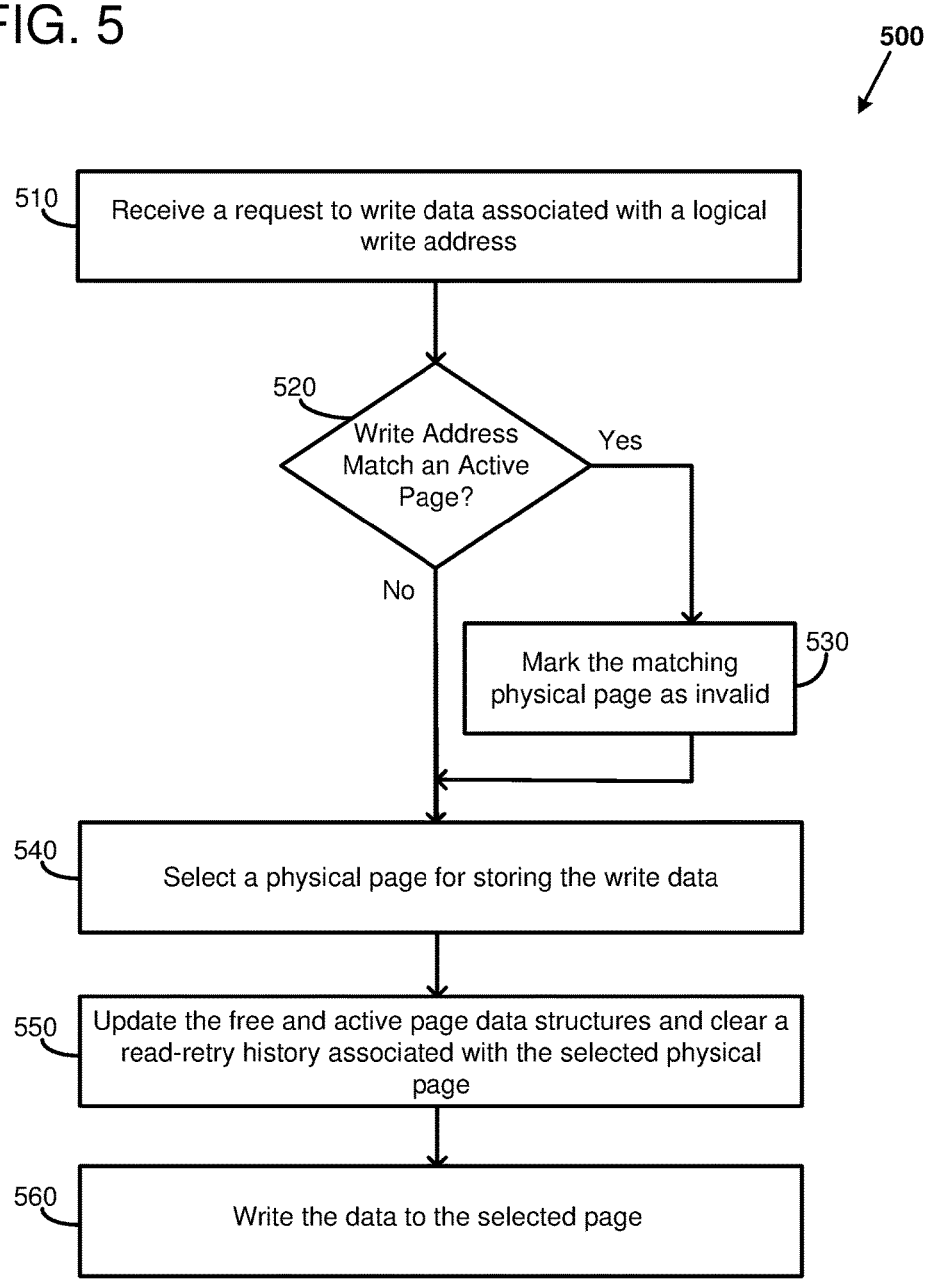
FIG. 5 is a flow diagram of an example method of writing information to the nonvolatile storage device.

FIG. 5 is a flow diagram of an example method 500 of writing information to the nonvolatile storage device. As one example, the method 500 can be implemented using a nonvolatile storage device architected as described above with reference to FIGS. 1-3. In particular, the method 500 can be implemented using a controller including a write datapath (e.g., a pipeline) for writing to a nonvolatile storage device.

At 510, a request to write data associated with a logical write address can be received. As one example, the write data can be a page of data, and the logical write address can be the starting address of the page of data to write to the nonvolatile storage device.

At 520, the logical write address can be compared to other logical addresses corresponding to data that is stored on the nonvolatile storage device. For example, the other logical addresses can include the starting logical addresses of each of the pages of information stored on the nonvolatile storage device. The other logical addresses can be found in a page table and/or an active list of the nonvolatile storage device, and each entry of the page table and/or active list can include both a logical address of the information and a physical address of the information. If the write address corresponds to an active page then the nonvolatile storage device already has information associated with the write address stored on it. Thus, the information stored on the nonvolatile storage device and corresponding to the active page is no longer valid, and the method 500 can continue at 530. However, if the write address does not correspond to an active page then the nonvolatile storage device does not have any information associated with the write address stored on it, and the method can continue at 540.

At 530, the physical page matching the write address can be marked is invalid. The invalid physical page now includes invalid or stale information and the page can be erased and reused at a later time, such as during a garbage collection phase.

At 540, a physical page of the nonvolatile storage device is selected for storing the write data of the request. For example, the selected physical page can be selected from a free-list data structure. The free-list data structure can include pages with erased and/or invalid information. If the selected physical page is not erased, the selected physical page can be erased before the write data is written to the selected physical page.

At 550, the free and active data structures can be updated. For example, the free-list data structure can be updated to include any physical page that may be invalidated at 530. As another example, the physical page selected at 540 can be removed from the free-list data structure and added to the active-list data structure. Any updates to the free-list data structure and/or the active-list data structure can be reflected in a page table. Additionally, a read-retry history for the selected physical page can be cleared since the information being written has not yet been read from the physical page.

At 560, the write data can be written to the nonvolatile storage device at the selected physical page. The write data can be encoded and/or augmented with error correction code (ECC) data before being written to the nonvolatile storage device. As one example, the controller can issue a write command to the nonvolatile storage device and can stream the write data (e.g., eight or sixteen bits at a time) and the ECC data to the nonvolatile storage device so that the write data can be stored.

Figure 6:
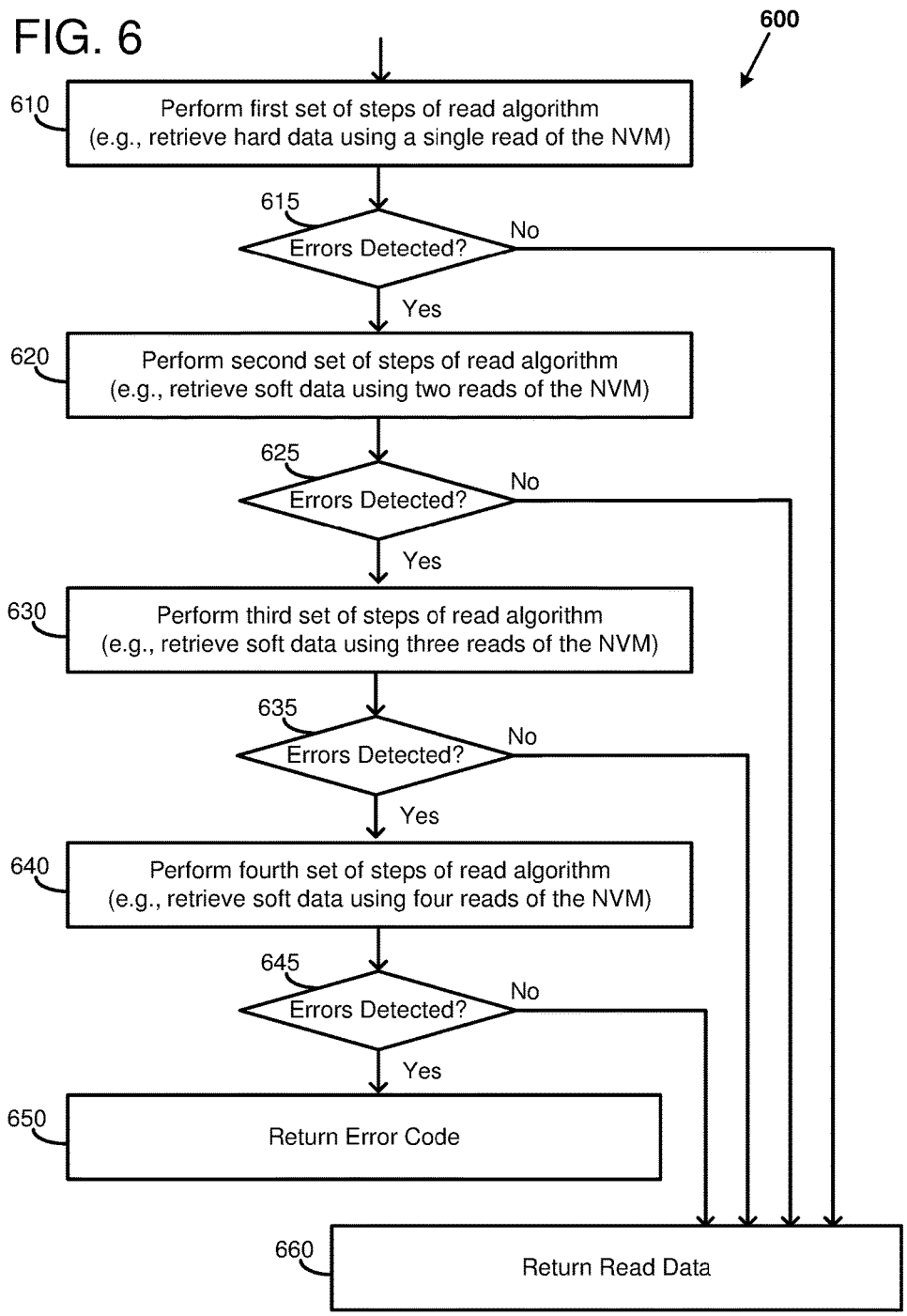
FIG. 6 is a flow diagram of an example method of a read algorithm for reading information from the nonvolatile storage device.

FIG. 6 is a flow diagram of an example method of a read algorithm for reading information from the nonvolatile storage device. As one example, the method 600 can be implemented using a nonvolatile storage device architected as described above with reference to FIGS. 1-3. In particular, the method 600 can be implemented using a controller including a read datapath (e.g., a pipeline) for reading from a nonvolatile storage device. The method 600 includes four different sets of retry steps, but more or fewer sets of retry steps are possible.

At 610, a first set of steps of the read algorithm can be performed. The first set of steps can be a default starting step for the read algorithm. As one example, the first set of steps can include performing a single read of a page of data from the nonvolatile storage device using a single reference voltage. The reference voltage can be used as a comparison voltage for a sense-amp of the nonvolatile storage device when reading data from the storage cells of the nonvolatile storage device. The first set of steps can include performing an error correction and detection algorithm on the data that is retrieved from the storage cells of the nonvolatile storage device. The first set of steps can include updating a read-retry history indicating whether the first set of steps were successfully used to recover the information from the nonvolatile memory. As a specific example, the first set of steps can include performing hard decoding of the data that is retrieved from the storage cells of the nonvolatile storage device.

At 615, it can be determined if the first set of steps of the read algorithm recovered the information stored in the storage cells of the nonvolatile storage device without any errors. If no errors are detected, the method 600 can continue at 660, and the recovered read data can be returned in a read response. However, if errors are detected, the method 600 can continue at 620.

At 620, a second set of steps of the read algorithm can be performed. The second set of steps can be a starting step for the read algorithm after it is detected that the first set of steps has a failure rate that exceeds a threshold failure rate. The failure rate can be specified for individual pages or for the entire nonvolatile memory. As one example, the second set of steps can include performing multiple reads (e.g., two reads) of a page of data from the nonvolatile storage device using different respective reference voltages. For example, a first reference voltage can have a positive offset from a default voltage and a second reference voltage can have a negative offset from a default voltage. The second set of steps can include performing an error correction and detection algorithm on the data that is retrieved from the storage cells of the nonvolatile storage device. Specifically, the data from reading the page using the first reference voltage and the data from reading the page using the second reference voltage can be used as inputs to the error correction and detection algorithm to decode the read data. The second set of steps can include updating a read-retry history indicating whether the second set of steps were successfully used to recover the information from the nonvolatile memory. As a specific example, the second set of steps can include performing soft decoding of the data that is retrieved from two reads of the storage cells of the nonvolatile storage device.

At 625, it can be determined if the second set of steps of the read algorithm recovered the information stored in the storage cells of the nonvolatile storage device without any errors. If no errors are detected, the method 600 can continue at 660, and the recovered read data can be returned in a read response. However, if errors are detected, the method 600 can continue at 630.

At 630, a third set of steps of the read algorithm can be performed. The third set of steps can be a starting step for the read algorithm after it is detected that the first and second set of steps have a failure rate that exceeds a threshold failure rate. The third set of steps can be similar to the second set of steps, except that more reads of the nonvolatile storage device can be used and a different decoding algorithm can be used to account for the extra information from the additional reads of the nonvolatile storage device.

At 635, it can be determined if the third set of steps of the read algorithm recovered the information stored in the storage cells of the nonvolatile storage device without any errors. If no errors are detected, the method 600 can continue at 660, and the recovered read data can be returned in a read response. However, if errors are detected, the method 600 can continue at 640.

At 640, a fourth set of steps of the read algorithm can be performed. The fourth set of steps can be a starting step for the read algorithm after it is detected that the first, second, and third set of steps have a failure rate that exceeds a threshold failure rate. The fourth set of steps can be similar to the third set of steps, except that more reads of the nonvolatile storage device can be used and a different decoding algorithm can be used to account for the extra information from the additional reads of the nonvolatile storage device.

At 645, it can be determined if the fourth set of steps of the read algorithm recovered the information stored in the storage cells of the nonvolatile storage device without any errors. If no errors are detected, the method 600 can continue at 660, and the recovered read data can be returned in a read response. In this example, the method 600 includes four sets of retry steps and if errors are detected after the fourth step, the method 600 cannot recover the information stored on the nonvolatile storage device. If the information cannot be recovered, at 650, an error code can be returned in a read response. The read response can either include the data with errors or it can exclude the data with errors.

Figure 7:
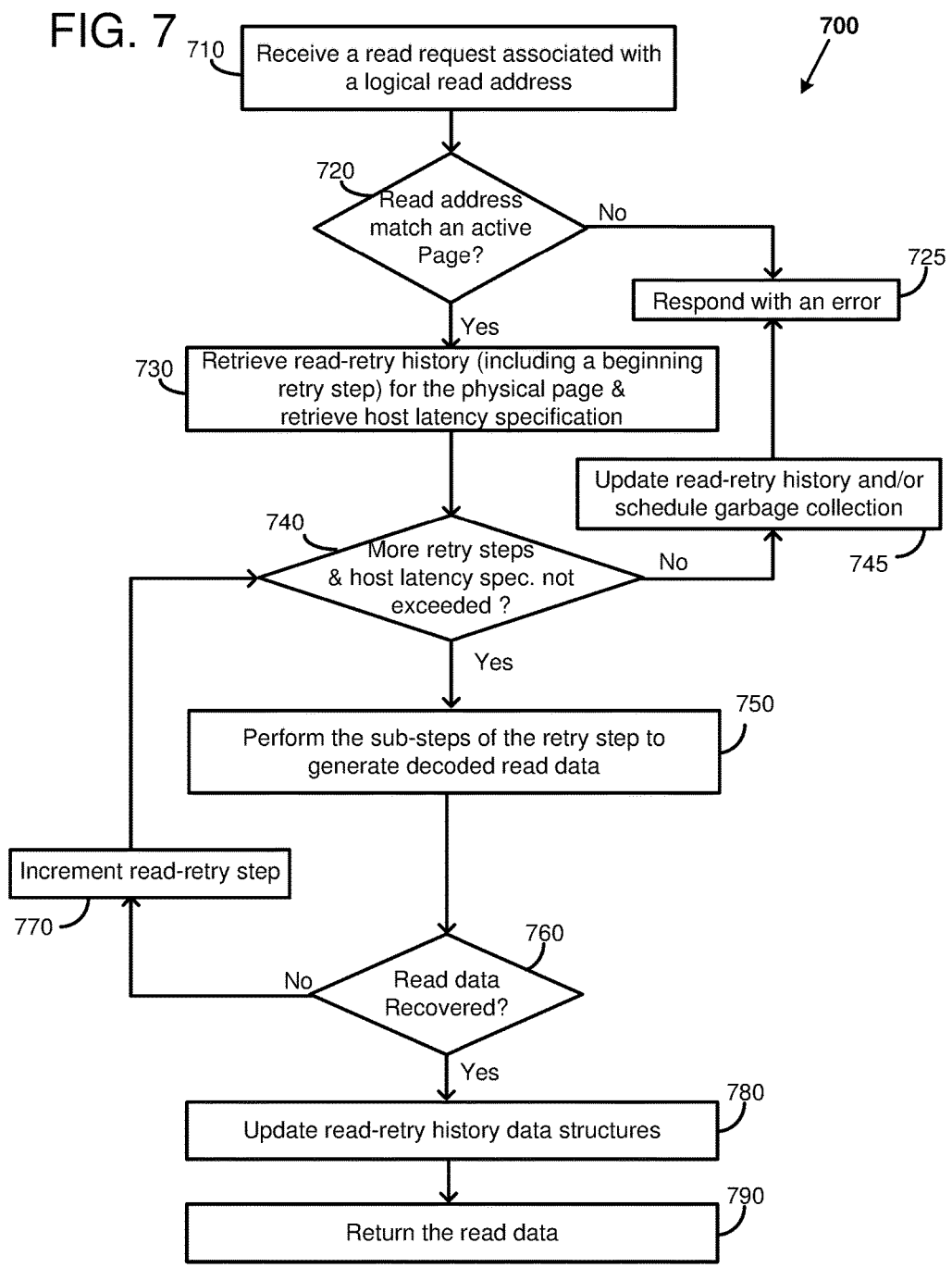
FIG. 7 is a flow diagram of an example method of reading information from the nonvolatile storage device using an adaptive read algorithm.

FIG. 7 is a flow diagram of an example method of reading information from the nonvolatile storage device using an adaptive read algorithm. As one example, the method 700 can be implemented using a nonvolatile storage device architected as described above with reference to FIGS. 1-3. In particular, the method 700 can be implemented using a controller including a read datapath (e.g., a pipeline) for reading from a nonvolatile storage device.

At 710, a read request associated with a logical read address can be received. For example, the logical read address can be a starting address for a page of data to read from the nonvolatile storage device. The read request can include a host identifier that indicates a source of the read request.

At 720, the logical read address can be compared to other logical addresses corresponding to data that is stored on the nonvolatile storage device. For example, the other logical addresses can include the starting logical addresses of each of the pages of information stored on the nonvolatile storage device. The other logical addresses can be found in a page table and/or an active list of the nonvolatile storage device, and each entry of the page table and/or active list can include both a logical address of the information and a physical address of the information. If the read address corresponds to an active page then the nonvolatile storage device already has information associated with the read address stored on it, and the method 700 can continue at 730. However, if the read address does not correspond to an active page then the nonvolatile storage device does not have any information associated with the read address stored on it, and the controller, at 725, can respond with an error.

At 730, a read-retry history can be retrieved for the page containing the read data. The read-retry history can include a beginning retry step for the page to be used for the adaptive read algorithm. A host latency specification can be retrieved for the host identified in the read request.

At 740, it can be determined whether a latency associated with the beginning retry step for the page is greater than the host latency specification and whether the adaptive read algorithm has more steps for retrieving the read data. If there are no more steps to be performed for the adaptive read algorithm or the latency of the current read request exceeds the host latency specification, the method 700 can continue at 745. However, if there are more steps to be performed for the adaptive read algorithm and the latency of the current read request does not exceed the host latency specification, the method 700 can continue at 750.

At 745, the read data for the page is not recoverable for this read request. The read-retry history can be updated to indicate any read-retry steps that failed. Additionally or alternatively, the page can be scheduled for garbage collection. For example, the page can be scheduled for garbage collection when the latency of the beginning retry step for the page is greater than the host latency specification. Scheduling the page for garbage collection can include adding a reference to the page to a data structure that identifies the pages that are ready for garbage collection. The garbage collector can select pages from the data structure (such as by using a first-in first-out order) and move the information from the selected page to a different page. After updating the read-retry history and/or scheduling the page for garbage collection, the method 700 can respond to the request with an error indicating that the read data was not recovered.

At 750, the sub-steps of the retry-step can be performed to generate decoded read data. For example, the sub-steps can include issuing one or more read requests to the nonvolatile storage device. The nonvolatile storage device can respond with read data and/or error correction code (ECC) data for each read request. The read data from the one or more reads can be used as an input to an ECC decoder so that any errors can potentially be detected and corrected using the read data and the ECC data.

At 760, it can be determined whether the read data was recovered without an error for the current retry step. If the read data was recovered without an error, the method 700 can continue at 780. However, if the read data was not recovered without an error then the method 700 can continue at 775. At 775, the read-retry step can be incremented (e.g., the next retry step can be attempted) and the method 700 can continue at 740.

At 780, the read-retry history data structure and other data structures can be updated. For example, the read-retry history can be updated to indicate any read-retry steps that failed. A failure rate can be determined for the read-retry steps that were used. If the failure rate for the beginning retry step transitions above the threshold failure rate, the beginning retry step can be changed (e.g., incremented) so that the failing retry step is skipped for the next read of the page. As another example, a count of the number of accesses of each page can be maintained. In particular, a count associated with the logical read address or the physical read address can be incremented. The count can be one factor used to determine whether the page is to be moved during garbage collection.

At 790, the read data can be returned. As one example, a status flag accompanying the read data can indicate whether the read data is error-free or if the read data includes errors.

Figure 8:
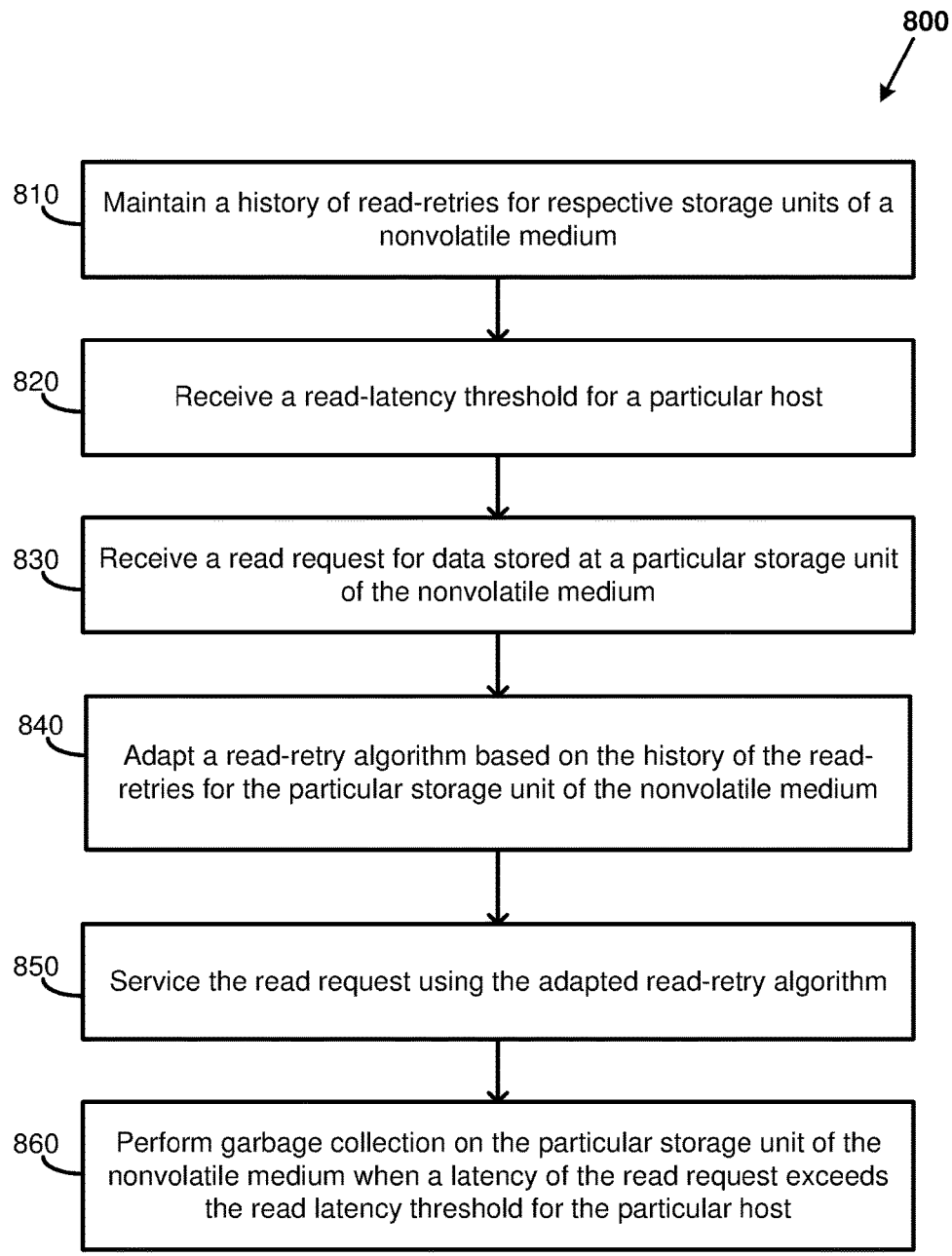
FIG. 8 is a flow diagram of an example method of reading information from the nonvolatile storage device using an adaptive read algorithm.

FIG. 8 is a flow diagram of an example method 800 of reading information from a nonvolatile medium using an adaptive read algorithm. The adaptive read algorithm can include multiple steps that are ordered relative to each other. The nonvolatile medium can be organized as a plurality of storage units. As one example, the storage unit can include a page of a NAND flash memory. As another example, the storage unit can include a block of a NAND flash memory, where the block is configured to be erased in a single operation.

At 810, a history of read-retries can be maintained for respective storage units of the nonvolatile medium. Maintaining the history of the read-retries can include tracking a beginning step of the read-retry algorithm and a number of failures of the beginning step for a given number of read requests. For example, the success or failure of the beginning step for the last ten read requests can be tracked.

At 820, a read-latency threshold can be received for a particular host. The read-latency threshold can indicate a maximum amount of time that the particular host can wait for read data before an error is generated. Multiple hosts can have access to the nonvolatile medium and each of the hosts can have different performance specifications. Thus, multiple read-latency thresholds can be received for different respective hosts.

At 830, a read request can be received for data stored at a particular storage unit of the nonvolatile medium. The read request can include various information, such as a host identifier indicating a source of the read request, and a logical or host address. The logical address can be mapped to a beginning address of the particular storage unit, for example.

At 840, a read-retry algorithm can be adapted based on the history of the read-retries for the particular storage unit of the nonvolatile medium. As one example, adapting the read-retry algorithm can include changing a beginning step of the read-retry algorithm so that a step earlier in the order is skipped. In particular, the beginning step of the read-retry algorithm can be changed in response to detecting that the step earlier in the order has a failure rate that exceeds a threshold failure rate. The adapted read-retry algorithm can perform differently for different requests originated by a controller of the nonvolatile medium and for requests originated by a host device external to the controller of the nonvolatile medium. For example, the adapted read-retry algorithm can exhaust all read-retry steps of the algorithm for requests originated by the controller.

At 850, the read request can be serviced using the adapted read-retry algorithm. Servicing the read request can include reading and decoding information stored at the particular storage unit of the nonvolatile medium and returning the decoded information to the source of the read request. In particular, the read-retry algorithm can start at the beginning step. If the read data is recovered without error, the decoded read data can be returned. If the read data for a given read-retry step contains errors, later steps of the read-retry algorithm can be performed until the read data is recovered without errors or there are no more steps of the read-retry algorithm to be performed. If the read data cannot be recovered without errors, an error message can be returned to the source of the read request. Additionally, an error can be returned when a latency for executing the adapted read-retry algorithm is greater than the read-latency threshold for the particular host. If the read latency for the beginning step is greater than the read-latency threshold for the particular host, the error can be returned without waiting for read data from the particular block (e.g., without issuing a read request to the particular block).

At 860, garbage collection can be performed on the particular storage unit of the nonvolatile medium. For example, garbage collection can be performed in response to detecting a latency for executing the adapted read-retry algorithm is greater than the read-latency threshold for the particular host. Specifically, the latency for the beginning step of the read-retry algorithm can exceed the read-latency threshold for the particular host. Garbage collection can include moving data stored at the particular storage unit (e.g., reading the data from one storage unit and writing the data to another storage unit) and erasing the particular block. Additionally, the history of read-retries for the particular block can be erased after the data is moved.

Example Computing Environment

Figure 9:
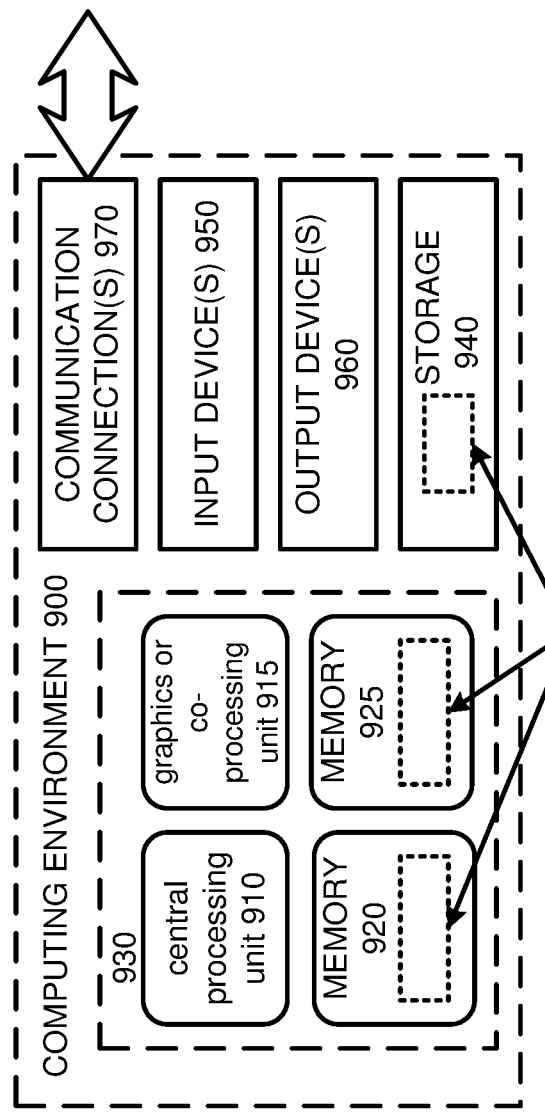
FIG. 9 depicts a generalized example of a suitable computing environment in which the described innovations may be implemented.

FIG. 9 depicts a generalized example of a suitable computing environment 900 in which the described innovations may be implemented. The computing environment 900 is not intended to suggest any limitation as to scope of use or functionality, as the innovations may be implemented in diverse general-purpose or special-purpose computing systems. For example, the computing environment 900 can be any of a variety of computing devices (e.g., desktop computer, laptop computer, server computer, tablet computer, etc.).

With reference to FIG. 9, the computing environment 900 includes one or more processing units 910, 915 and memory 920, 925. In FIG. 9, this basic configuration 930 is included within a dashed line. The processing units 910, 915 execute computer-executable instructions. A processing unit can be a general-purpose central processing unit (CPU), a processor in an application-specific integrated circuit (ASIC) or any other type of processor. In a multi-processing system, multiple processing units execute computer-executable instructions to increase processing power. For example, FIG. 9 shows a central processing unit 910 as well as a graphics processing unit or co-processing unit 915. The tangible memory 920, 925 may be volatile memory (e.g., registers, cache, RAM), nonvolatile memory (e.g., ROM, EEPROM, flash memory, etc.), or some combination of the two, accessible by the processing unit(s). The memory 920, 925 stores software 980 implementing one or more innovations described herein, in the form of computer-executable instructions suitable for execution by the processing unit(s).

A computing system may have additional features. For example, the computing environment 900 includes storage 940, one or more input devices 950, one or more output devices 960, and one or more communication connections 970. An interconnection mechanism (not shown) such as a bus, controller, or network interconnects the components of the computing environment 900. Typically, operating system software (not shown) provides an operating environment for other software executing in the computing environment 900, and coordinates activities of the components of the computing environment 900.

The tangible storage 940 may be removable or non-removable, and includes magnetic disks, magnetic tapes or cassettes, CD-ROMs, DVDs, or any other medium which can be used to store information in a non-transitory way and which can be accessed within the computing environment 900. The storage 940 stores instructions for the software 980 implementing one or more innovations described herein.

The input device(s) 950 may be a touch input device such as a keyboard, mouse, pen, or trackball, a voice input device, a scanning device, or another device that provides input to the computing environment 900. The output device(s) 960 may be a display, printer, speaker, CD-writer, or another device that provides output from the computing environment 900.

The communication connection(s) 970 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. We therefore claim as our invention all that comes within the scope of these claims.

What is claimed is:

1. A solid-state storage device comprising:
 a flash memory comprising a plurality of blocks; and
 a controller in communication with the flash memory, the controller configured to:
  maintain a history of read-retries for respective blocks of the solid-state storage device, the history comprising an indication of a failure or success of a given read-retry step of a read-retry algorithm for earlier reads of the respective blocks;
  receive a read request for data stored at a particular block of the solid-state storage device;
  adapt the read-retry algorithm based on the history of the read-retries for the particular block of the solid-state storage device; and
  service the read request using the adapted read-retry algorithm.

2. The solid-state storage device of claim 1, wherein the read-retry algorithm comprises a plurality of ordered steps, and adapting the read-retry algorithm comprises changing a beginning step of the read-retry algorithm so that a step earlier in the order is skipped.

3. The solid-state storage device of claim 2, wherein the beginning step of the read-retry algorithm is changed in response to detecting that the step earlier in the order has a failure rate that exceeds a threshold failure rate.

4. The solid-state storage device of claim 1, wherein the controller is further configured to:
 receive a read-latency threshold for a particular host, and wherein servicing the read request using the adapted read-retry algorithm comprises returning an error without reading the particular block when a latency for executing the adapted read-retry algorithm is greater than the read-latency threshold for the particular host.

5. The solid-state storage device of claim 4, wherein the controller is further configured to:
 move data stored at the particular block in response to detecting that the latency for executing the adapted read-retry algorithm is greater than the read-latency threshold for the particular host; and
 erase the particular block and the history of read-retries for the particular block after the data is moved.

6. A method comprising:
 recording a history of read-retries for read requests to individual storage units of a nonvolatile medium, the nonvolatile medium organized as a plurality of storage units;
 adapting a read algorithm for a read request to a particular storage unit based on the history of the read-retries for the read requests to the individual storage units of the nonvolatile medium; and
 receiving a latency specification for a host associated with the read request, and wherein the adapted read algorithm for the read request to the particular storage unit comprises returning an error code without waiting for data from the nonvolatile medium when a read latency associated with the starting step exceeds the latency specification for the host associated with the read request.

7. The method of claim 6, wherein the read algorithm comprises a plurality of steps that are ordered relative to each other, and wherein adapting the read algorithm for the read request to the particular storage unit comprises changing from a current starting step to a different starting step for read requests to the particular storage unit of the nonvolatile medium.

8. The method of claim 7, wherein changing to the different starting step for read requests to the particular storage unit is in response to determining that a failure rate of the current starting step is greater than a threshold failure rate.

9. The method of claim 6, further comprising:
 scheduling the particular storage unit for garbage collection when the read latency associated with the starting step exceeds the latency specification for the host associated with the read request.

10. The method of claim 9, further comprising:
 performing the garbage collection for the particular storage unit, wherein the garbage collection comprises moving data from the particular storage unit to a different storage unit, erasing the particular storage unit, and erasing the history of read-retries for read requests to the particular storage unit.

11. The method of claim 6, wherein recording the history of read-retries for read requests comprises recording a starting step of the read-retry algorithm and a number of failures of the starting step for a given number of read requests.

12. The method of claim 6, wherein the adapted read algorithm for the read request to the particular storage unit is different for requests originated by a controller of the nonvolatile medium than for requests originated by a host device external to the controller of the nonvolatile medium.

13. A controller configured to:
 track a history of read-retries for respective pages of a nonvolatile medium, the nonvolatile medium organized as a plurality of pages; and
 respond to a given read request for a particular page of the nonvolatile medium using an adaptive read algorithm that is adapted based on the history of the read-retries for the respective pages of the nonvolatile medium, wherein responding to the given read request comprises:
  skipping a first read-retry step when the history of the read-retries for the particular page indicates that a failure rate of the first read-retry step is greater than a threshold failure rate; and
  performing a second read-retry step when the history of the read-retries for the particular page indicates that the failure rate of the first read-retry step is greater than the threshold failure rate.

14. The controller of claim 13, wherein responding to the given read request comprises performing a first read-retry step when the history of the read-retries for the particular page indicates that a failure rate of the first read-retry step is less than a threshold failure rate.

15. The controller of claim 13, wherein tracking the history of read-retries for respective pages of the nonvolatile medium comprises determining whether data retrieved for a particular page is reconstructed without error when using a given read-retry step.

16. The controller of claim 13, wherein responding to the given read request for the particular page comprises comparing a specified read-latency associated with a beginning read step for the particular page to a specified read-latency of a host associated with the given read request.

17. The controller of claim 16, wherein responding to the given read request for the particular page comprises returning an error code without waiting for read results from the nonvolatile medium when the specified read-latency associated with the beginning read step for the particular page is greater than the specified read-latency of the host associated with the given read request.

18. The controller of claim 16, wherein the controller is further configured to:
schedule the particular page for garbage collection when the specified read-latency associated with the beginning read step for the particular page is greater than the specified read-latency of the host associated with the given read request.

* * * * *